(12) United States Patent
Wu et al.

(10) Patent No.: US 8,981,389 B2
(45) Date of Patent: Mar. 17, 2015

(54) ILLUMINATION DEVICE

(75) Inventors: Chia-Hao Wu, Taipei (TW);
Chun-Chang Wu, New Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 222 days.

(21) Appl. No.: 13/557,403

(22) Filed: Jul. 25, 2012

(65) Prior Publication Data
US 2013/0087816 A1    Apr. 11, 2013

Related U.S. Application Data

(62) Division of application No. 13/271,169, filed on Oct. 11, 2011, now Pat. No. 8,299,489.

(51) Int. Cl.
| | |
|---|---|
| *H01L 33/50* | (2010.01) |
| *F21K 99/00* | (2010.01) |
| *F21V 3/00* | (2006.01) |
| *H01L 33/56* | (2010.01) |
| *F21Y 101/02* | (2006.01) |

(52) U.S. Cl.
CPC .............. *H01L 33/508* (2013.01); *F21K 9/135* (2013.01); *F21K 9/30* (2013.01); *F21K 9/56* (2013.01); *F21V 3/00* (2013.01); *H01L 33/56* (2013.01); *F21Y 2101/02* (2013.01); *H01L 33/507* (2013.01); *H01L 2933/0091* (2013.01)
USPC ............. 257/88; 257/100; 257/102; 257/103; 257/E33.061

(58) Field of Classification Search
USPC ..................... 257/88, 100, 102, 103, E33.061
See application file for complete search history.

(56) References Cited

U.S. PATENT DOCUMENTS

2012/0032573 A1 *   2/2012   Lai .................................. 313/45

* cited by examiner

*Primary Examiner* — Long Pham
(74) *Attorney, Agent, or Firm* — Li & Cai Intellectual Property (USA) Office

(57) ABSTRACT

An illumination device includes a base, a light-emitting module, a first layer, and a second layer. The light-emitting module is disposed on the base for generating a progressive-type light-emitting intensity. The first layer encapsulates the light-emitting module. The second layer encloses the first layer. The second layer has a progressive-type thickness corresponding to the progressive-type light-emitting intensity, and both the progressive-type light-emitting intensity and the progressive-type thickness are decreased or increased gradually, thus the progressive-type light-emitting intensity can be transformed into the same light-emitting intensity through the progressive-type thickness of the second layer.

5 Claims, 13 Drawing Sheets

ILLUMINATION DEVICE

CROSS REFERENCE TO RELATED APPLICATION

This application is a divisional application of Ser. No. 13/271,169 filed on Oct. 11, 2011, which is a continuation-in-part of U.S. application Ser. No. 12/849,491, filed on Aug. 3, 2010 and entitled "photoelectric semiconductor device capable of generating uniform compound lights", which is a continuation application of U.S. application Ser. No. 12/401,620, filed on Mar. 11, 2009, now U.S. Pat. No. 7,888,698, and entitled "photoelectric semiconductor device capable of generating uniform compound lights", the entire disclosures of which are incorporated herein by reference.

BACKGROUND OF THE INVENTION

1. Field of the Invention

The instant disclosure relates to an illumination device, and more particularly, to an illumination device with a progressive-type design for generating a uniform light-emitting source having the same light-emitting intensity.

2. Description of Related Art

Light-emitting diode (LED) has been outstanding in energy-saving lighting with its features of small size, long device lifetime, high durability, environmental friendliness, and low power consumption. Of all the LEDs, white light LED (or LED with compound lights) combines two or more monochromatic lights and has been widely used in indicating lamps and display devices in information technology, communications, and consumer electronics products. In addition to improving the light emission efficiency, the unevenness of lights from the LED also requires an urgent solution in the study of compound LED and lamp.

To solve the unevenness issue, a prior art with coating phosphor onto the surface of the LED chip has been proposed. However, another problem, such as limited chip type, high cost, low light emission efficiency or narrow light angle is encountered.

SUMMARY OF THE INVENTION

One aspect of the instant disclosure relates to an illumination device for generating a uniform light-emitting source having the same light-emitting intensity.

One of the embodiments of the instant disclosure provides an illumination device, comprising: a base, a light-emitting module, a first layer, and a second layer. The light-emitting module is disposed on the base for generating a progressive-type light-emitting intensity. The first layer encapsulates the light-emitting module. The second layer encloses the first layer, wherein the second layer has a progressive-type thickness corresponding to the progressive-type light-emitting intensity, both the progressive-type light-emitting intensity and the progressive-type thickness are decreased or increased gradually, and the progressive-type light-emitting intensity is transformed into the same light-emitting intensity through the progressive-type thickness of the second layer.

Another one of the embodiments of the instant disclosure provides an illumination device, comprising: a base, a light-emitting module, a first layer, and a second layer. The light-emitting module is disposed on the base for generating a progressive-type light-emitting intensity. The first layer encapsulates the light-emitting module. The second layer encloses the first layer and having a phosphor powder, wherein the second layer has a progressive-type concentration of the phosphor powder corresponding to the progressive-type light-emitting intensity, both the progressive-type light-emitting intensity and the progressive-type concentration of the phosphor powder are decreased or increased gradually, and the progressive-type light-emitting intensity is transformed into the same light-emitting intensity through the progressive-type concentration of the phosphor powder in the second layer.

Yet another one of the embodiments of the instant disclosure provides an illumination device, comprising: a base, a light-emitting module, a first layer, and a second layer. The light-emitting module is disposed on the base and electrically connected to the base for generating a progressive-type light-emitting intensity. The first layer encapsulates the light-emitting module. The second layer encloses the first layer and has a phosphor powder with a plurality of phosphor particles, wherein the second layer has a progressive-type particle radius of the phosphor powder corresponding to the progressive-type light-emitting intensity, the progressive-type light-emitting intensity varies inversely as the progressive-type particle radius of the phosphor powder, and the progressive-type light-emitting intensity is transformed into the same light-emitting intensity through the progressive-type particle radius of the phosphor powder in the second layer.

Yet further another one of the embodiments of the instant disclosure provides an illumination device, comprising: a base, a light-emitting module, an encapsulation layer, and a phosphor layer. The light-emitting module includes at least one optoelectronic component disposed on the base for generating a first light having a progressive-type light-emitting intensity. The encapsulation layer encapsulates the at least one optoelectronic component. The phosphor layer with a phosphor powder encloses the encapsulation layer and has a progressive-type structure in correlation with the progressive-type light-emitting intensity, wherein the progressive-type structure is one of a progressive-type thickness, a progressive-type concentration of the phosphor powder, and a progressive-type particle radius of the phosphor powder, and the first light passes through the phosphor layer to generate a second light having the same light-emitting intensity.

These and other objectives of the instant disclosure will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1A:
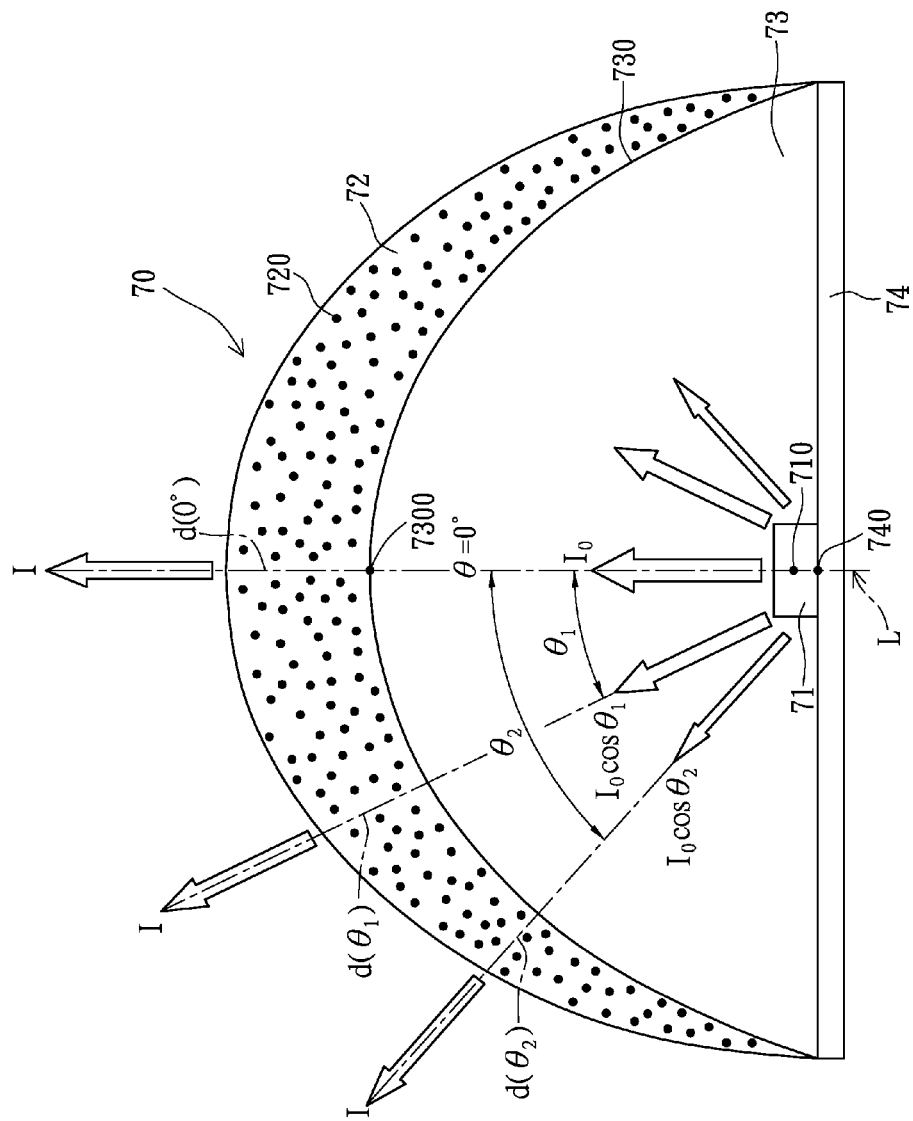
FIG. 1A is an illustration of the illumination device using at least one optoelectronic component according to the first exemplary embodiment of the instant disclosure.

Before the instant disclosure is described in greater detail in connection with the preferred embodiments, it should be noted that similar elements and structures are designated by like reference numerals throughout the entire disclosure.

Referring to FIG. 1A, there is the first exemplary embodiment of an illumination device 70 using at least one optoelectronic component 71. The illumination device 70 includes a base 74, the optoelectronic component 71, a first layer 73 (such as an encapsulation layer), and a second layer 72. In this embodiment, only one optoelectronic component 71 is served as a light-emitting module for emitting light, however in alternative embodiment, more than one optoelectronic components 71 as described below also can be adopted as the light-emitting module. The optoelectronic component 71 is disposed on the base 74 and electrically connected to the base 74 for generating a progressive-type light-emitting intensity $I(\theta)$ decreased gradually from a top surface of the optoelectronic component 71 to a peripheral surface of the optoelectronic component 71. The first layer 73 encapsulates the optoelectronic component 71, and the second layer 72 encloses the first layer 73. The second layer 72 has a progressive-type thickness $d(\theta)$ corresponding to the progressive-type light-emitting intensity $I(\theta)$, both the progressive-type light-emitting intensity $I(\theta)$ and the progressive-type thickness $d(\theta)$ are simultaneously decreased or increased gradually, i.e. there is a positive correlation between the progressive-type light-emitting intensity $I(\theta)$ and the progressive-type thickness $d(\theta)$, thus the progressive-type light-emitting intensity $I(\theta)$ generated by the optoelectronic component 71 can be transformed into the same light-emitting intensity I through the progressive-type thickness $d(\theta)$ of the second layer 72. In other words, the illumination device 70 in this embodiment can generate the same light-emitting intensity I by matching the progressive-type light-emitting intensity $I(\theta)$ generated by the optoelectronic component 71 and the progressive-type thickness $d(\theta)$ of the second layer 72.

In this embodiment, the second layer 72 can be disposed above the first layer 73. The outline of the first layer 73 may be cambered upwardly to form a semicircle having a cambered outer surface 730, and the shape of the outer surface 730 of the first layer 73 can correspond to the shape of an inner surface (not labeled) of the second layer 72, thus the inner surface of the second layer 72 corresponding to the outer surface 730 of the first layer 73 can be inwardly concaved. The optoelectronic component 71 can be disposed directly under a topmost point 7300 of the first layer 73, i.e. disposed on a centric position 740 of the base 74. In other words, the topmost point 7300 is a midpoint on the outer surface 730 of the first layer 73 and is equal to a highest point (not labeled) of the inner surface of the second layer 72. The optoelectronic component 71 may be a LED chip for emitting a monochromatic light, and the base may be a printed circuit board (PCB), a metal core printed circuit board (MCPCB), a metal substrate, a glass substrate, or a ceramics substrate etc. The first layer 73 may be a transparent, a translucent layer (such as thermoplastic polymers or thermosetting polymers), or an air layer etc., and the second layer 72 may be a phosphor layer formed by dispersing a phosphor powder with a plurality of phosphor particles 720 into polymer resin, such as epoxy or silicone. In addition, the progressive-type light-emitting intensity $I(\theta)$ generated by the optoelectronic component 71 can be a function of $\theta$ defined by $I(\theta)=I_0 \cos \theta$, where $\theta$ is a light-emitting angle of the optoelectronic component 71 relative to a vertical center line L, and $I_0$ is a maximum light-emitting intensity generated by the optoelectronic component 71 and usually generated along the vertical center line L of the optoelectronic component 71 and corresponding to the topmost point 7300 of the first layer 73. The vertical center line L can be defined as an extended line vertically passes through a center point 710 of the optoelectronic component 71. In this embodiment, the vertical center line L also passes through the topmost point 7300 of the first layer 73, the highest point of the inner surface of the second layer 72 or the centric position 740 of the base 74. Because the progressive-type thickness $d(\theta)$ divided by the progressive-type light-emitting intensity $I(\theta)$ equals a constant number c as shown by $$\frac{d(\theta)}{I(\theta)} = c,$$

the progressive-type thickness $d(\theta)$ of the second layer 72 can be a function of $\theta$ defined by $d(\theta)=cI_0 \cos \theta$. Hence, if the concentration of the phosphor powder in the second layer 72 is substantially uniform and the particle dimensions of the phosphor particles 720 in the second layer 72 are substantially the same, the progressive-type thickness $d(\theta)$ of the second layer 72 can be a function of $\theta$ defined by $d(\theta)=cI_0 \cos \theta$ due to the definition of $$\frac{d(\theta)}{I(\theta)} = c.$$

Since the second layer 72 may be the phosphor layer having the phosphor powder with the phosphor particles 720, a first light (not shown) with the progressive-type light-emitting intensity $I(\theta)$ emitted from the optoelectronic component 71 of the light-emitting module can sequentially pass through the first layer 73 and the second layer 72 to generate a second light (not shown) with the same light-emitting intensity I after wavelength conversion of the first light.

In other words, when the light-emitting angle $\theta$ of the optoelectronic component 71 relative to the vertical center line L is 0 degree, the progressive-type light-emitting intensity $I(\theta=0°)$ generated by the optoelectronic component 71 as shown by $I(0°)=I_0 \cos 0°=I_0$ can correspond to the progressive-type thickness) $d(\theta=0°)$ of the second layer 72 as shown by) $d(0°)$. When the light-emitting angle $\theta$ of the optoelectronic component 71 relative to the vertical center line L is $\theta_1$, the progressive-type light-emitting intensity $I(\theta=\theta_1)$ generated by the optoelectronic component 71 as shown by $I(\theta_1)=I_0 \cos \theta_1$ can correspond to the progressive-type thickness $d(\theta=\theta_1)$ of the second layer 72 as shown by $d(\theta_1)$. When the light-emitting angle $\theta$ of the optoelectronic component 71 relative to the vertical center line L is $\theta_2$, the progressive-type light-emitting intensity $I(\theta=\theta_2)$ generated by the optoelectronic component 71 as shown by $I(\theta_2)=I_0 \cos \theta_2$ can correspond to the progressive-type thickness $d(\theta=\theta_2)$ of the second layer 72 as shown by $d(\theta_2)$. Furthermore, the above description here is the illustration between the light-emitting intensity $I(\theta)$ of the optoelectronic component 71 and the progressive-type thickness $d(\theta)$ of the second layer 72 on one side area (such as the left half area) relative to the vertical center line L, but there is the same relationship between the light-emitting intensity $I(\theta)$ of the optoelectronic component 71 and the progressive-type thickness $d(\theta)$ of the second layer 72 on another side area (such as the right half area) relative to the vertical center line L.

Therefore, when the light-emitting angle $\theta$ of the optoelectronic component 71 is increased gradually such as $0°<\theta_1<\theta_2$, the progressive-type light-emitting intensity $I(\theta)$ generated by the optoelectronic component 71 is decreased gradually such as $I_0>I_0 \cos \theta_1>I_0 \cos \theta_2$, thus the optoelectronic component 71 cannot provide a uniform light-emitting source due to different light-emitting angles $\theta$ of the optoelectronic component 71. However, when the first layer 73 is disposed under the second layer 72, the progressive-type thickness $d(\theta)$ of the second layer 72 decreased gradually such as) $d(0°)>d(\theta_1)>d(\theta_2)$ can correspond to the progressive-type light-emitting intensity $I(\theta)$ generated by the optoelectronic component 71 decreased gradually such as $I_0>I_0 \cos \theta_1>I_0 \cos \theta_2$, thus the progressive-type light-emitting intensity $I(\theta)$ generated by the optoelectronic component 71 can be transformed into the same light-emitting intensity I through the progressive-type thickness $d(\theta)$ of the second layer 72. In other words, when both the progressive-type light-emitting intensity $I(\theta)$ generated by the optoelectronic component 71 and the progressive-type thickness $d(\theta)$ of the second layer 72 are simultaneously decreased gradually according to the increasing light-emitting angle $\theta$ of the optoelectronic component 71, the progressive-type thickness $d(\theta)$ divided by the progressive-type light-emitting intensity $I(\theta)$ can equal to a constant number c as shown by $$\frac{d(\theta)}{I(\theta)} = c,$$

thus the progressive-type light-emitting intensity $I(\theta)$ generated by the optoelectronic component 71 can be transformed into the same light-emitting intensity I through the progressive-type thickness $d(\theta)$ of the second layer 72. Hence, the illumination device 70 in this embodiment can provide a uniform light-emitting source by using the progressive-type thickness $d(\theta)$ of the second layer 72.

Figure 1B:
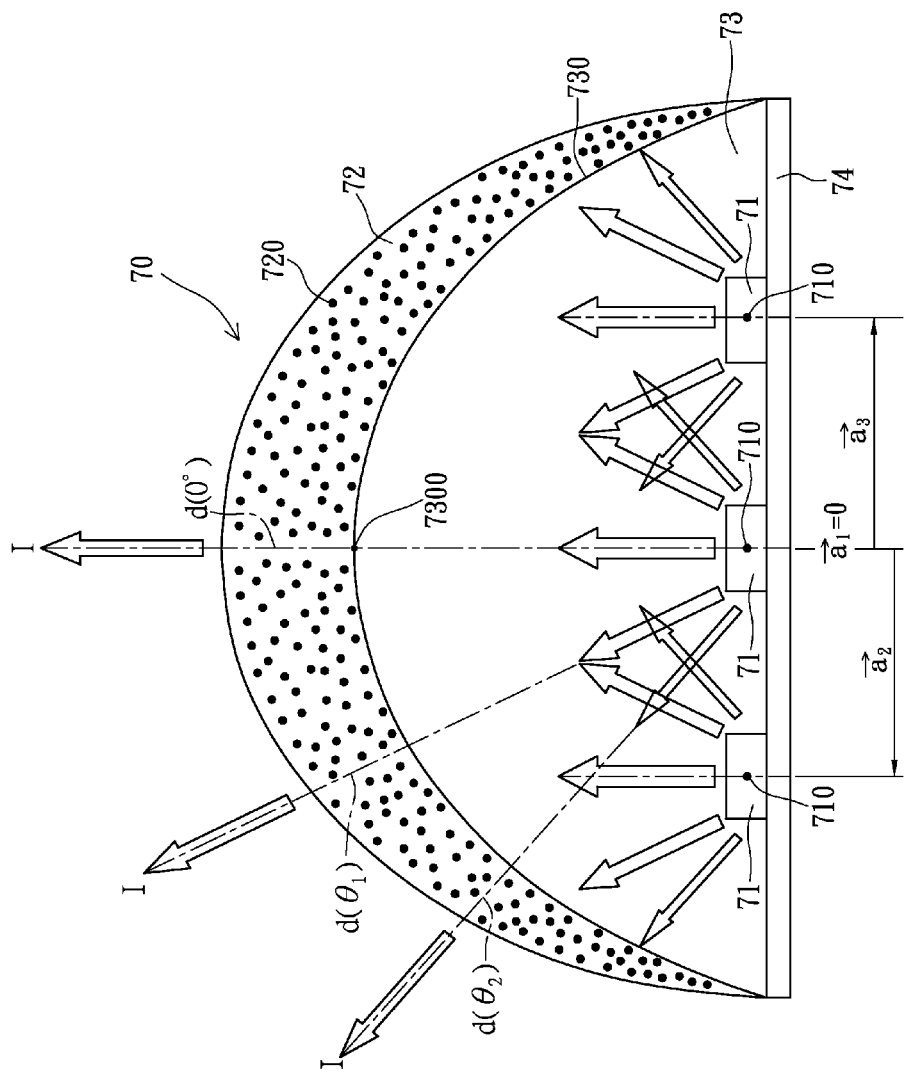
FIG. 1B is an illustration of the illumination device using three optoelectronic components according to the first exemplary embodiment of the instant disclosure.

Referring to FIG. 1B, it shows an illumination device 70 using a plurality of optoelectronic components 71. In this embodiment, the illumination device 70 includes a base 74, three optoelectronic components 71, a first layer 73, and a second layer 72. Similar to the above description, the three optoelectronic components 71 are served as the light-emitting module for emitting light and can be covered with the first layer 73, and the first layer 73 can be covered with the second layer 72. Further, the arrangement of the optoelectronic components 71 on the base 74 in this embodiment is merely an example and is not meant to limit the instant disclosure.

Figure 1C:
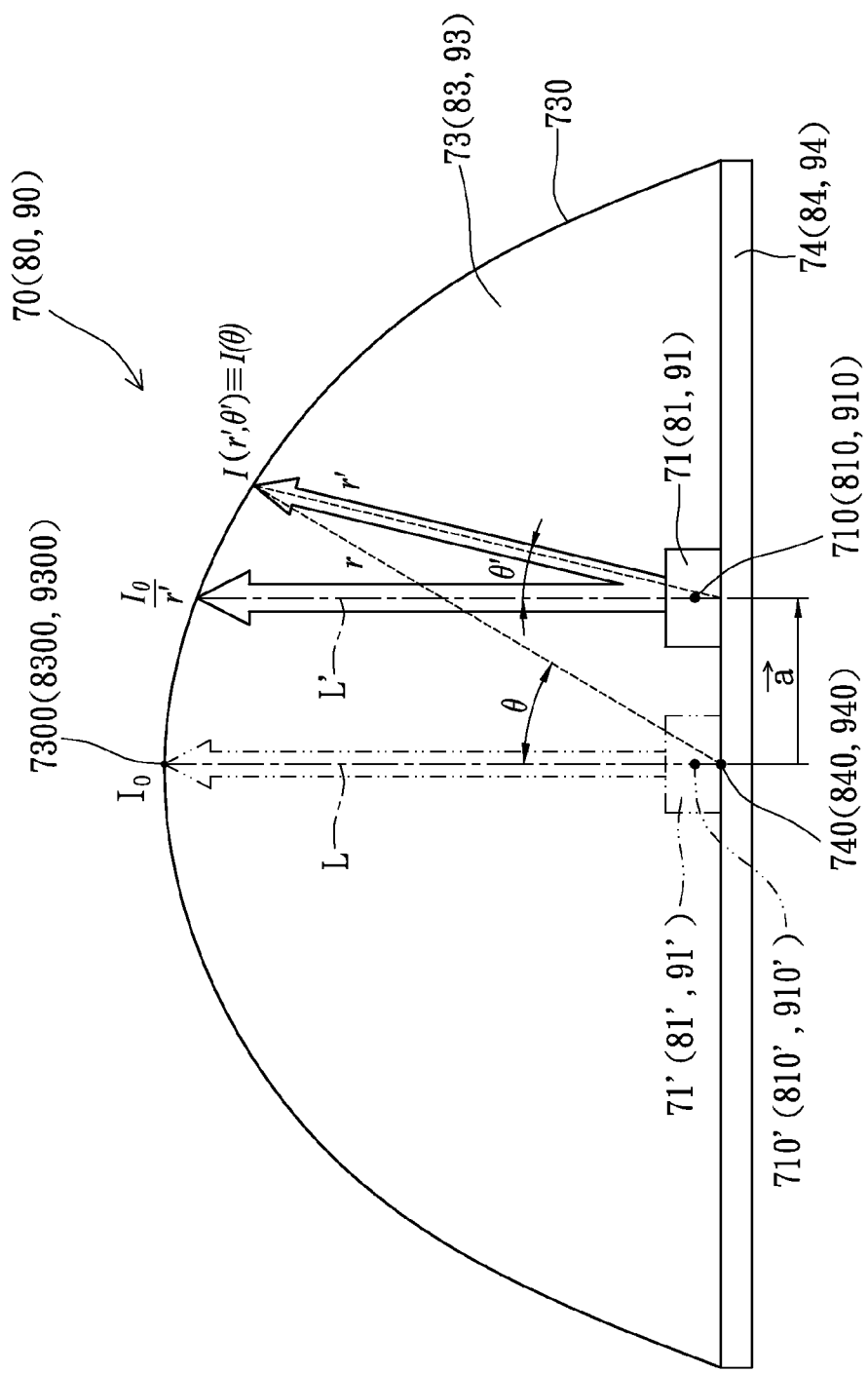
FIG. 1C is an illustration of the first, the second, and the third exemplary embodiments of the illumination device using at least one offset optoelectronic component separated from an imaginary optoelectronic component according to the instant disclosure.

Referring to FIG. 1C, it shows the illumination device using at least one offset optoelectronic component. There is an imaginary optoelectronic component 71' imaginatively disposed on the centric position 740 of the base 74 and directly under the topmost point 7300 of the first layer 73 or under the highest point of the inner surface of the second layer 72 as shown in FIGS. 1A and 1B, and when an optoelectronic components 71 is separated from the imaginary optoelectronic component 71' by a horizontal offset distance $\vec{a}$, the progressive-type light-emitting intensity $I(r',\theta')$ generated by the optoelectronic component 71 is a function of r' and $\theta'$ defined by $$I(r', \theta') = \frac{I_0}{r'} \cos\theta',$$

where $\theta'$ is a light-emitting angle of the optoelectronic component 71 relative to its vertical center line L', $I_0$ is a maximum light-emitting intensity generated by the imaginary optoelectronic component 71', and r' is a radius between the optoelectronic component 71 and the outer surface 730 of the first layer 73. Moreover, the trigonometric function relationship between $\theta$, $\theta'$, r, r', and $\vec{a}$ can be defined by $r \sin \theta - \vec{a} = r' \sin \theta'$, $r \cos \theta = r' \cos \theta'$, and $r'^2 = r^2 + a^2 - 2r\vec{a} \sin \theta$, where $\theta$ is a light-emitting angle of the imaginary optoelectronic component 71' relative to a vertical center line L that can vertically pass through a center point 710' of the imaginary optoelectronic component 71', and r is a radius of the first layer 73. Hence, the progressive-type light-emitting intensity $I(r',\theta')$ generated by the optoelectronic component 71 defined by $$I(r', \theta') = \frac{I_0}{r'} \cos\theta'$$

can be substantially transmitted into the progressive-type light-emitting intensity $I(\theta)$ generated by the optoelectronic component 71 defined by $$I(\theta) = \frac{I_0 r}{r'^2} \cos\theta = \frac{I_0}{r} \cos\theta \left(1 + \frac{\vec{a}^2}{r^2} - 2\frac{\vec{a}}{r}\sin\theta\right)^{-1},$$

thus the progressive-type light-emitting intensity $I(r',\theta')$ generated by the optoelectronic component 71 can approximate to the progressive-type light-emitting intensity $I(\theta)$ generated by the optoelectronic component 71, i.e. shown by $I(r',\theta') \equiv I(\theta)$.

Referring to FIGS. 1B and 1C, because the progressive-type light-emitting intensity $I(\theta)$ generated by any one of the three optoelectronic components 71 can be a function of $\theta$ defined by $$I(\theta) = \frac{I_0 r}{r'^2}\cos\theta = \frac{I_0}{r}\cos\theta\left(1 + \frac{\vec{a}^2}{r^2} - 2\frac{\vec{a}}{r}\sin\theta\right)^{-1},$$

thus the progressive-type light-emitting intensity I(θ) generated by the light-emitting module including the three optoelectronic components 71 can be a function of θ defined by $$I(\theta) = \sum_i I_i(\theta) = \frac{I_0}{r}\cos\theta\sum_i\left(1 + \frac{\vec{a}_i^2}{r^2} - 2\frac{\vec{a}_i}{r}\sin\theta\right)^{-1},$$

wherein i is the amount of the optoelectronic components 71, $\vec{a}_i$ is a horizontal offset distance between the center point 710 of each corresponding optoelectronic component 71 and the center point 710' of the imaginary optoelectronic component 71' that is imaginatively disposed on the centric position 740 of the base 74 and directly under the topmost point 7300 of the first layer 73 or the highest point of the inner surface of the second layer 72 as shown in FIG. 1B, θ is a light-emitting angle of the imaginary optoelectronic component 71' relative to a vertical center line L that can vertically pass through the center point 710' of the imaginary optoelectronic component 71', $I_0$ is a maximum light-emitting intensity generated by the imaginary optoelectronic component 71', and r is a radius of the first layer 73. For example, when the amount of the optoelectronic components 71 (i) is three, the horizontal offset distance ($\vec{a}_i$) between the center point 710 of each corresponding optoelectronic component 71 and the center point 710' of the imaginary optoelectronic component 71' can be defined by $\vec{a}_1$, $\vec{a}_2$, and $\vec{a}_3$ as shown in FIG. 1B, where $\vec{a}_1$ can be equal to zero ($\vec{a}_1$=0) or larger than zero, and $\vec{a}_2$ and $\vec{a}_3$ can be the same or different according to different design requirements. Because the progressive-type thickness d(θ) divided by the progressive-type light-emitting intensity I(θ) equals a constant number c as shown by $$\frac{d(\theta)}{I(\theta)} = c,$$

the progressive-type thickness d(θ) of the second layer 72 can be a function of θ defined by $$d(\theta) = c\frac{I_0}{r}\cos\theta\sum_i\left(1 + \frac{\vec{a}_i^2}{r^2} - 2\frac{\vec{a}_i}{r}\sin\theta\right)^{-1},$$

thus the progressive-type light-emitting intensity I(θ) generated by the light-emitting module can be transformed into the same light-emitting intensity I through the progressive-type thickness d(θ) of the second layer 72.

Figure 1D:
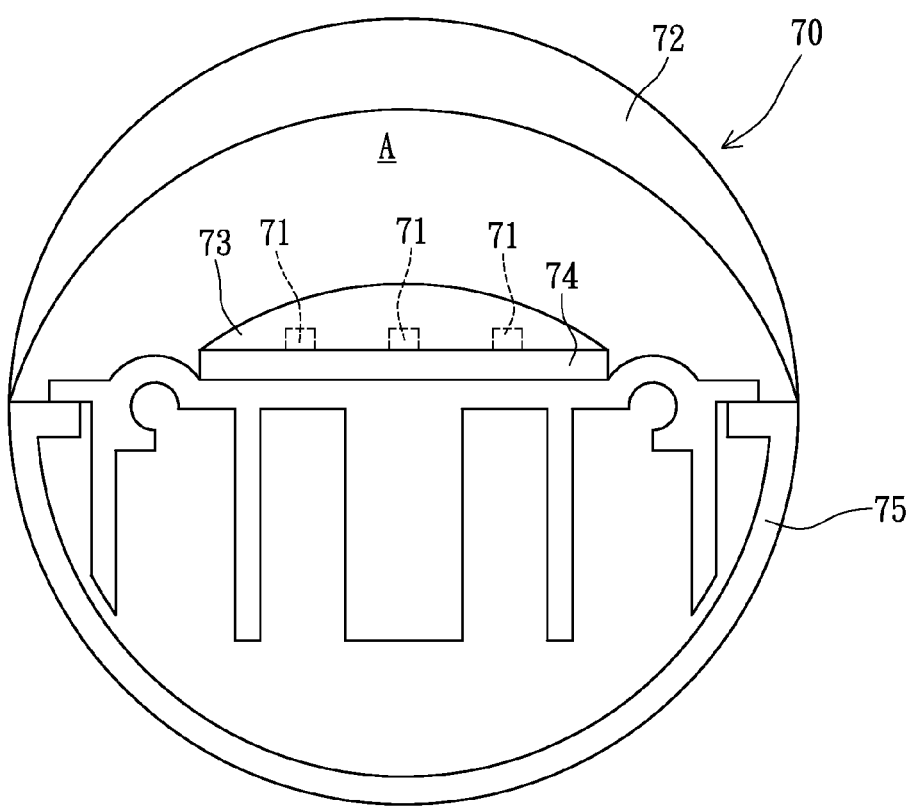
FIG. 1D is an illustration of the illumination device applied as a lamp tube according to the first exemplary embodiment of the instant disclosure.
Figure 1E:
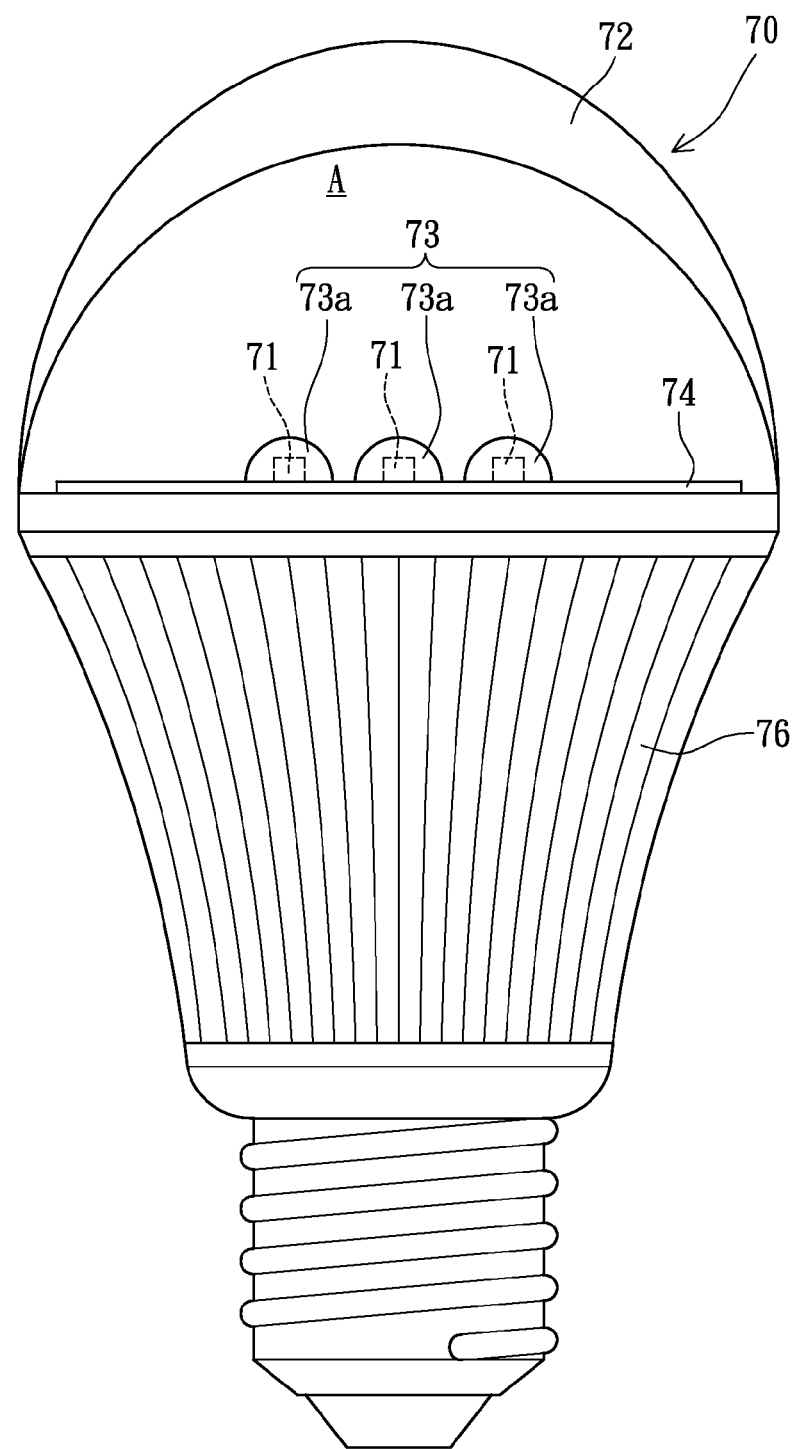
FIG. 1E is an illustration of the illumination device applied as a lamp bulb according to the first exemplary embodiment of the instant disclosure.

Furthermore, the illumination device 70 can further include a holder module that may be a tube holder 75 (as shown in FIG. 1D) or a bulb holder 76 (as shown in FIG. 1E) as a support structure for supporting the base 74. Referring to FIGS. 1D and 1E, the second layer 72 can be separated from the first layer 73 to form an air layer A between the first layer 73 and the second layer 72. In FIG. 1D, the first layer 73 can be a single encapsulation layer to encapsulate three optoelectronic components 71. In FIG. 1E, the first layer 73 having a plurality of encapsulating units 73a used to respectively encapsulate respective optoelectronic components 71. The thickness of the second layer 72 of the illumination device 70 still has the same relationship as described above. Of course, the type of holder module in FIG. 1D or FIG. 1E can be changed into another type. In alternative embodiment, the structure of encapsulating the optoelectronic components 71 with the first layer 73 in FIG. 1D can be replaced by another structure of respectively encapsulating the optoelectronic components 71 with respective encapsulating units 73a in FIG. 1E, or the structure of respectively encapsulating the optoelectronic components 71 with respective encapsulating units 73a in FIG. 1E can be replaced by another structure of encapsulating the optoelectronic components 71 with the first layer 73 in FIG. 1D. In other words, the illumination device 70 can be used as a lamp tube or a lamp bulb for providing a uniform light-emitting source having the same light-emitting intensity.

Figure 2A:
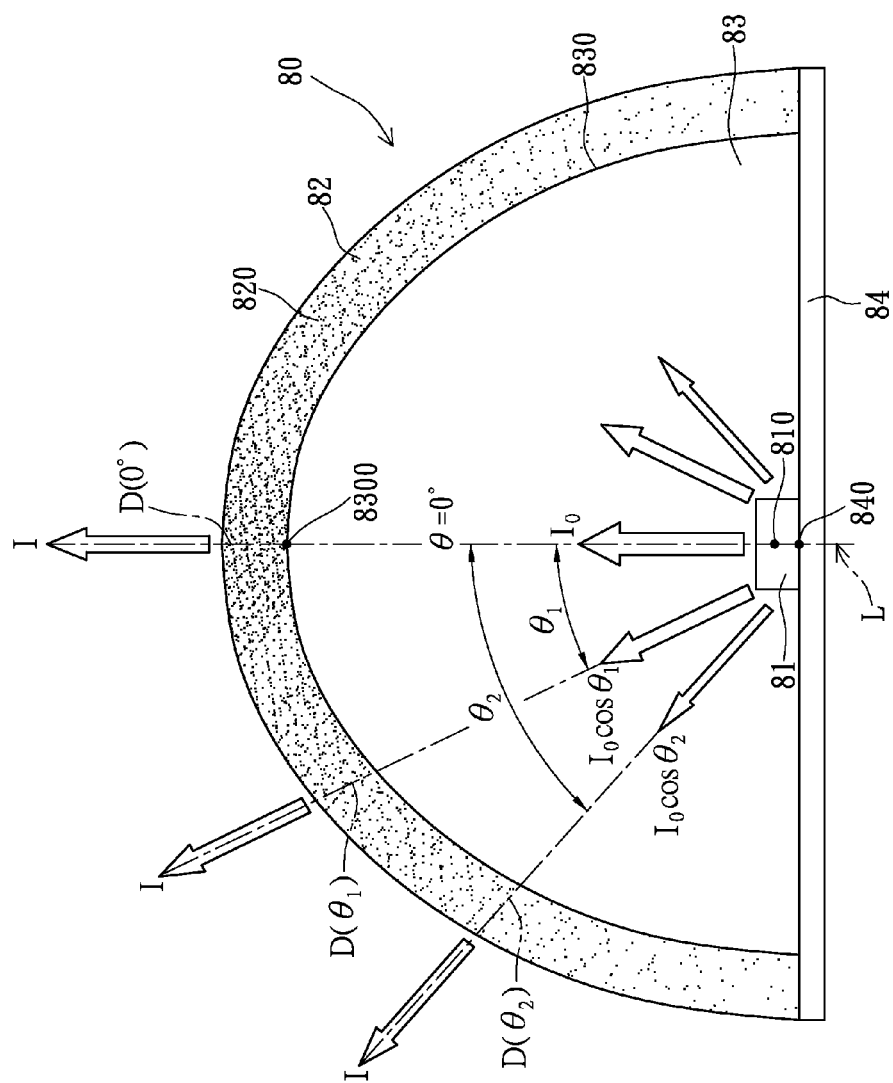
FIG. 2A is an illustration of the illumination device using at least one optoelectronic component according to the second exemplary embodiment of the instant disclosure.

Referring to FIG. 2A, it shows the second exemplary embodiment of an illumination device 80 using at least one optoelectronic component 81. The illumination device 80 of the second embodiment is similar to the illumination device 70 of the first embodiment. However, the difference therebetween is that: the second layer 82 in this embodiment has a progressive-type concentration D(θ) of the phosphor powder rather than the progressive-type thickness d(θ) as described above. The progressive-type concentration D(θ) is corresponding to the progressive-type light-emitting intensity I(θ), both the progressive-type light-emitting intensity I(θ) and the progressive-type concentration D(θ) are simultaneously decreased or increased gradually, i.e. there is a positive correlation between the progressive-type light-emitting intensity I(θ) and the progressive-type concentration D(θ), thus the progressive-type light-emitting intensity I(θ) generated by the optoelectronic component 81 can be transformed into the same light-emitting intensity I through the progressive-type concentration D(θ) of the phosphor powder in the second layer 82. In other words, the illumination device 80 in this embodiment can generate the same light-emitting intensity I by matching the progressive-type light-emitting intensity I(θ) generated by the optoelectronic component 81 and the progressive-type concentration D(θ) of the phosphor powder in the second layer 82.

Similar to the above-mentioned deduction, the progressive-type concentration D(θ) of the phosphor powder divided by the progressive-type light-emitting intensity I(θ) equals a constant number c as shown by $$\frac{D(\theta)}{I(\theta)} = c,$$

the progressive-type concentration D(θ) of the phosphor powder in the second layer 82 can be a function of θ defined by D(θ)=$cI_0$ cos θ. Hence, if the thickness of the second layer 82 is substantially the same and the particle dimensions of the phosphor particles 820 in the second layer 82 are substantially the same, the progressive-type concentration D(θ) of the phosphor powder in the second layer 82 can be a function of θ defined by D(θ)=$cI_0$ cos θ due to the definition of $$\frac{D(\theta)}{I(\theta)} = c.$$

Since the second layer 82 contains the phosphor powder with a plurality of phosphor particles 820, a first light (not shown) with the progressive-type light-emitting intensity I(θ) emitted from the optoelectronic component 81 of the light-emitting module can sequentially pass through the first layer 83 and the second layer 82 to generate a second light (not shown) with the same light-emitting intensity I after wavelength conversion of the first light.

Similarly, when the light-emitting angle θ of the optoelectronic component 81 relative to the vertical center line L is 0 degree, the progressive-type light-emitting intensity I(θ=0°) generated by the optoelectronic component 81 as shown by I(0°)=$I_0$ cos 0°=$I_0$ can correspond to the progressive-type concentration D(θ=0°) of the phosphor powder in the second layer 82 as shown by D(0°). When the light-emitting angle θ of the optoelectronic component 81 relative to the vertical center line L is $\theta_1$, the progressive-type light-emitting intensity I(θ=$\theta_1$) generated by the optoelectronic component 81 as shown by I($\theta_1$)=$I_0$ cos $\theta_1$ can correspond to the progressive-type concentration D(θ=$\theta_1$) as shown by D($\theta_1$). When the light-emitting angle θ of the optoelectronic component 81 relative to the vertical center line L is $\theta_2$, the progressive-type light-emitting intensity I(θ=$\theta_2$) generated by the optoelectronic component 81 as shown by I($\theta_2$)=$I_0$ cos $\theta_2$ can correspond to the progressive-type concentration D(θ=$\theta_2$) as shown by D($\theta_2$).

Therefore, when the light-emitting angle θ is increased gradually such as 0°<$\theta_1$<$\theta_2$, the progressive-type light-emitting intensity I(θ) is decreased gradually such as $I_0$>$I_0$ cos $\theta_1$>$I_0$ cos $\theta_2$, thus the optoelectronic component 81 cannot provide a uniform light-emitting source due to different light-emitting angles θ of the optoelectronic component 81. However, when the first layer 83 is covered with the second layer 82, the progressive-type concentration D(θ) decreased gradually such as D(0°)>D($\theta_1$)>D($\theta_2$) can correspond to the progressive-type light-emitting intensity I(θ) decreased gradually such as $I_0$>$I_0$ cos $\theta_1$>$I_0$ cos $\theta_2$, thus the progressive-type light-emitting intensity I(θ) can be transformed into the same light-emitting intensity I through the progressive-type concentration D(θ). In other words, when both the progressive-type light-emitting intensity I(θ) and the progressive-type concentration D(θ) are simultaneously decreased gradually according to the increasing light-emitting angle θ of the optoelectronic component 81 and the function of $$\frac{D(\theta)}{I(\theta)} = c,$$

thus the progressive-type light-emitting intensity I(θ) generated by the optoelectronic component 81 can be transformed into the same light-emitting intensity I through the progressive-type concentration D(θ) of the phosphor powder in the second layer 82. Hence, the illumination device 80 can provide a uniform light-emitting source by using the progressive-type concentration D(θ) of the phosphor powder in the second layer 82.

Figure 2B:
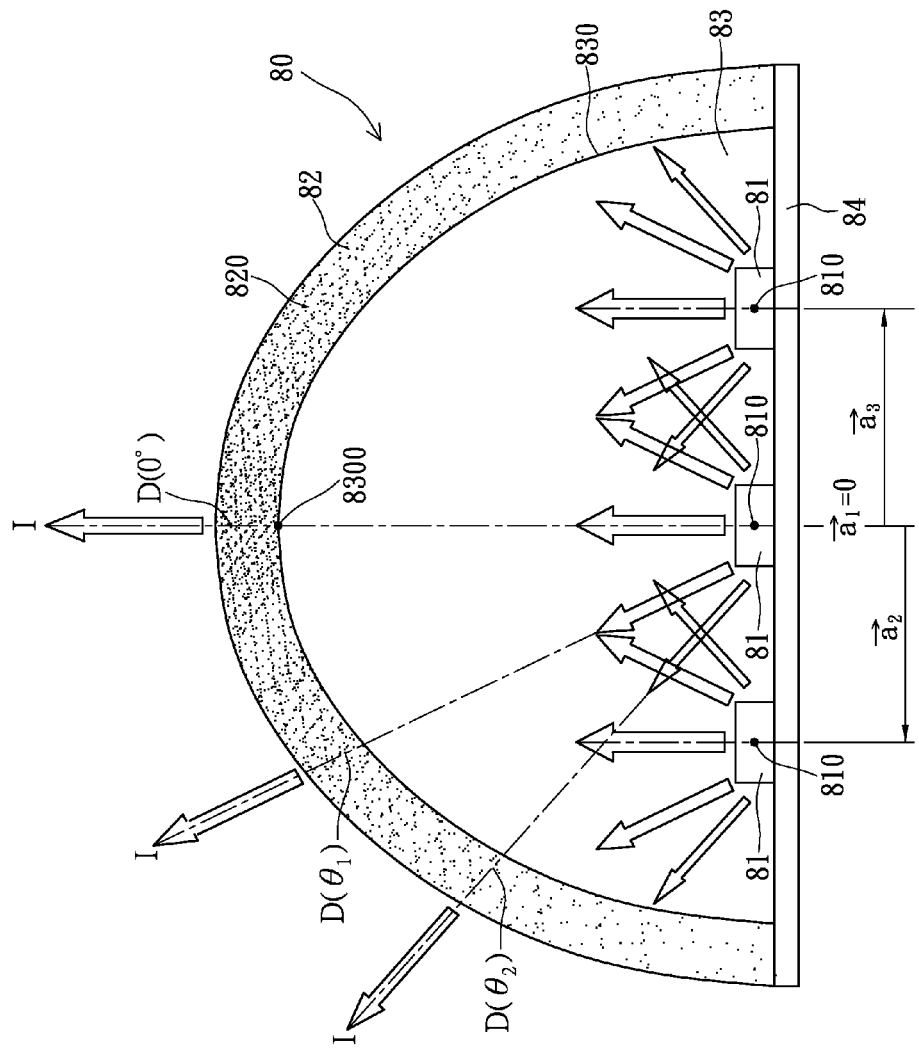
FIG. 2B is an illustration of the illumination device using three optoelectronic components according to the second exemplary embodiment of the instant disclosure.

Referring to FIG. 2B, it shows an illumination device 80 using a plurality of optoelectronic components 81. The illumination device 80 in FIG. 2B is similar to the illumination device 70 in FIG. 1A and includes a base 84, three optoelectronic components 81, a first layer 83, and a second layer 82. Similar to the above description, the three optoelectronic components 81 are served as the light-emitting module for emitting light and can be covered with the first layer 83, and the first layer 83 can be covered with the second layer 82.

Further, the arrangement of the optoelectronic components 81 on the base 84 in this embodiment is merely an example and is not meant to limit the instant disclosure.

Referring to FIGS. 2B and 1C, because the progressive-type light-emitting intensity I(θ) generated by any one of the three optoelectronic components 81 can be a function of θ defined by $$I(\theta) = \frac{I_0 r}{r'^2}\cos\theta = \frac{I_0}{r}\cos\theta\left(1 + \frac{\vec{a}^2}{r^2} - 2\frac{\vec{a}}{r}\sin\theta\right)^{-1}$$

the same as the first embodiment, thus the progressive-type light-emitting intensity I(θ) generated by the light-emitting module including the three optoelectronic components 81 can be a function of θ defined by $$I(\theta) = \sum_i I_i(\theta) = \frac{I_0}{r}\cos\theta \sum_i \left(1 + \frac{\vec{a}_i^2}{r^2} - 2\frac{\vec{a}_i}{r}\sin\theta\right)^{-1},$$

wherein i is the amount of the optoelectronic components 81, $\vec{a}_i$ is a horizontal offset distance between the center point 810 of each corresponding optoelectronic component 81 and the center point 810' of the imaginary optoelectronic component 81' that is imaginatively disposed on a centric position 840 of the base 84, θ is a light-emitting angle of the imaginary optoelectronic component 81' relative to a vertical center line L of the imaginary optoelectronic component 81', $I_0$ is a maximum light-emitting intensity generated by the imaginary optoelectronic component 81', and r is a radius of the first layer 83. Similar to the first embodiment, three optoelectronic components 81 have respective horizontal offset distances $\vec{a}_1$, $\vec{a}_2$, and $\vec{a}_3$, as shown in FIG. 2B. Because of the definition of $$\frac{D(\theta)}{I(\theta)} = c,$$

the progressive-type concentration D(θ) of the phosphor powder in the second layer 82 can be a function of θ defined by $$D(\theta) = c\frac{I_0}{r}\cos\theta \sum_i \left(1 + \frac{\vec{a}_i^2}{r^2} - 2\frac{\vec{a}_i}{r}\sin\theta\right)^{-1},$$

thus the progressive-type light-emitting intensity I(θ) generated by the light-emitting module can be transformed into the same light-emitting intensity I through the progressive-type concentration D(θ) of the phosphor powder in the second layer 82.

Figure 2C:
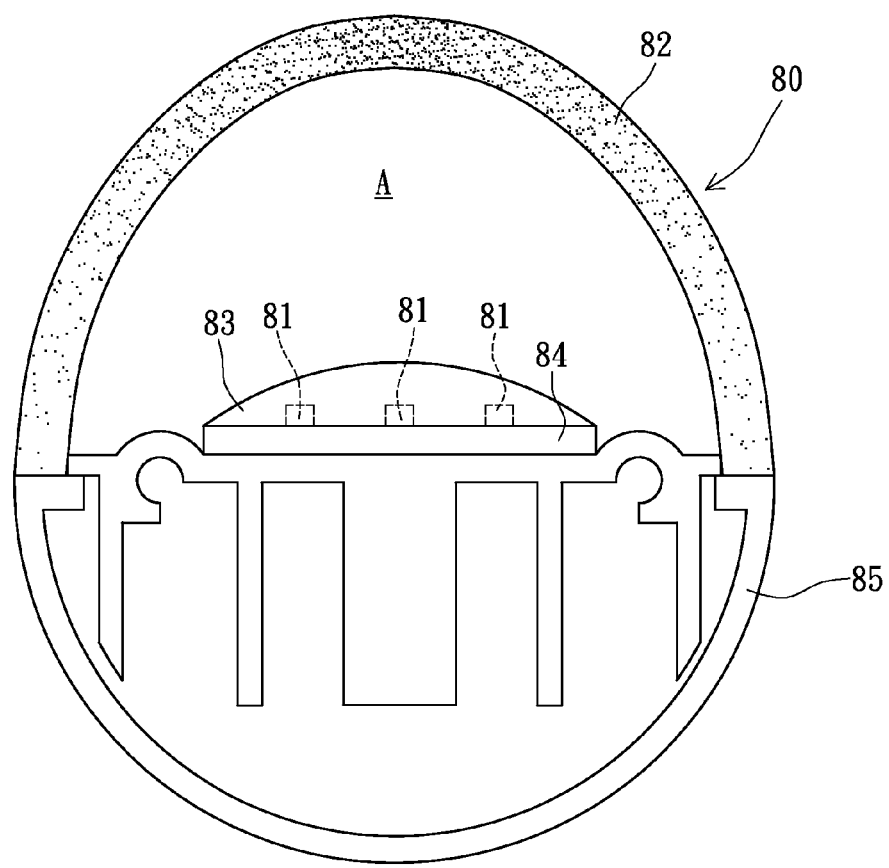
FIG. 2C is an illustration of the illumination device applied as a lamp tube according to the second exemplary embodiment of the instant disclosure.
Figure 2D:
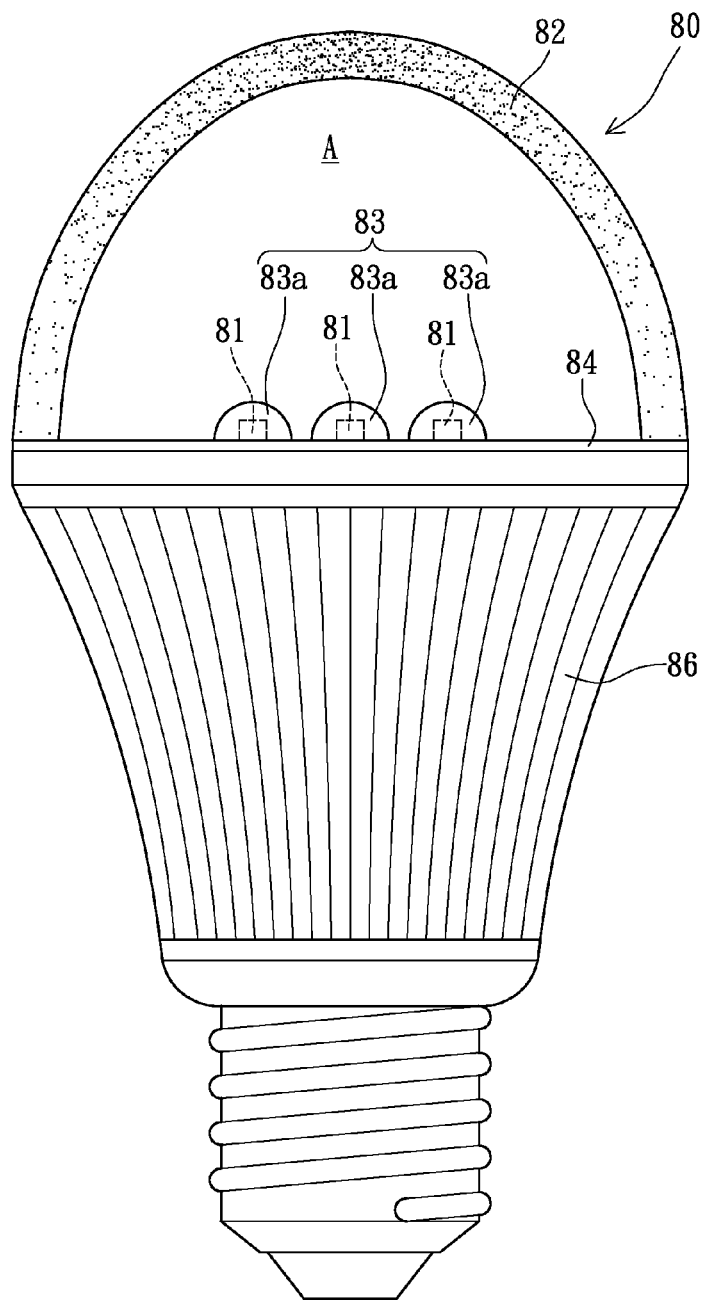
FIG. 2D is an illustration of the illumination device applied as a lamp bulb according to the second exemplary embodiment of the instant disclosure.

Furthermore, the illumination device 80 can further include a holder module that may be a tube holder 85 (as shown in FIG. 2C) or a bulb holder 86 (as shown in FIG. 2D) as a support structure for supporting the base 84. Referring to FIGS. 2C and 2D, the second layer 82 can be separated from the first layer 83 to form an air layer A between the first layer 83 and the second layer 82. In FIG. 2C, the first layer 83 can be a single encapsulation layer to encapsulate three optoelectronic components 81. In FIG. 2D, the first layer 83 having a plurality of encapsulating units 83a used to respectively encapsulate respective optoelectronic components 81. The concentration of the second layer 82 of the illumination device 80 still has the same relationship as described above. Of course, the type of holder module in FIG. 2C or FIG. 2D can be changed into another type. In alternative embodiment, the structure of encapsulating the optoelectronic components 81 with the first layer 83 in FIG. 2C can be replaced by another structure of respectively encapsulating the optoelectronic components 81 with respective encapsulating units 83a in FIG. 2D, or the structure of respectively encapsulating the optoelectronic components 81 with respective encapsulating units 83a in FIG. 2D can be replaced by another structure of encapsulating the optoelectronic components 81 with the first layer 83 in FIG. 2C. In other words, the illumination device 80 can be used as a lamp tube or a lamp bulb for providing a uniform light-emitting source having the same light-emitting intensity.

Figure 3A:
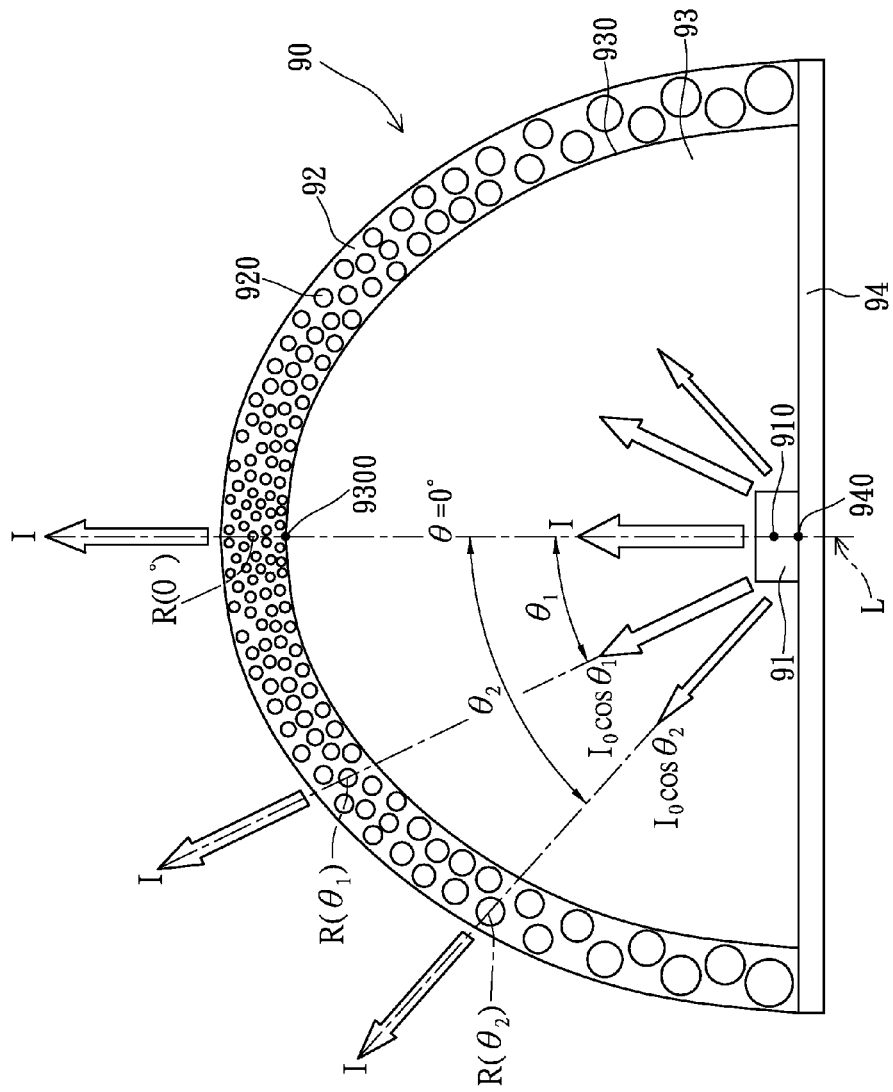
FIG. 3A is an illustration of the illumination device using at least one optoelectronic component according to the third exemplary embodiment of the instant disclosure.

Referring to FIG. 3A, its shows the third exemplary embodiment of an illumination device 90 using at least one optoelectronic component 91. The illumination device 90 of the third embodiment is similar to the illumination device 70 or 80 in the first or second embodiment. However, the difference therebetween is that: the second layer 92 in this embodiment has a progressive-type particle radius $R(\theta)$ of the phosphor powder rather than the progressive-type thickness $d(\theta)$ or the progressive-type concentration $D(\theta)$ as described above. The progressive-type particle radius $R(\theta)$ can correlate with the progressive-type light-emitting intensity $I(\theta)$, the progressive-type light-emitting intensity $I(\theta)$ can be decreased or increased gradually, the progressive-type particle radius $R(\theta)$ of the phosphor powder can be decreased or increased gradually, and the progressive-type light-emitting intensity $I(\theta)$ can be varied inversely as the progressive-type particle radius $R(\theta)$ of the phosphor powder, i.e. there is a negative correlation between the progressive-type light-emitting intensity $I(\theta)$ and the progressive-type particle radius $R(\theta)$, thus the progressive-type light-emitting intensity $I(\theta)$ generated by the optoelectronic component 91 can be transformed into the same light-emitting intensity I through the progressive-type particle radius $R(\theta)$ of the phosphor powder in the second layer 92. In other words, the illumination device 90 of the instant disclosure can generate the same light-emitting intensity I by matching the progressive-type light-emitting intensity $I(\theta)$ generated by the optoelectronic component 91 and the progressive-type particle radius $R(\theta)$ of the phosphor powder in the second layer 92.

Similar to the above-mentioned deduction, the progressive-type particle radius $R(\theta)$ multiplied by the progressive-type light-emitting intensity $I(\theta)$ equals a constant number c as shown by $R(\theta)*I(\theta)=c$, the progressive-type particle radius $R(\theta)$ can be a function of $\theta$ defined by $$R(\theta) = \frac{c}{I_0 \cos\theta}.$$

Of course, because the total volume V of the whole phosphor particles 920 can be defined by $V=N*4/3\pi R^3$, where N is the amount of the phosphor particles 920 and R is a radius of the phosphor particle 920, thus it is very clear to know that the total surface area S of the phosphor particles 920 can be defined by $S=N*4\pi R^2=3V/R \propto 1/R$, and $$R(\theta) = \frac{c}{I(\theta)} = \frac{c}{I_0 \cos\theta}$$

is obtained due to the definition of $$\frac{S(\theta)}{I(\theta)} = c.$$

Hence, if the concentration of the phosphor powder in the second layer 92 is substantially uniform and the thickness of the second layer 92 is substantially the same, the progressive-type particle radius $R(\theta)$ of the phosphor powder in the second layer 92 can be a function of $\theta$ defined by $$R(\theta) = \frac{c}{I_0 \cos\theta}$$

due to the definition of $R(\theta)*I(\theta)=c$. Since the second layer 92 is the phosphor layer, a first light (not shown) with the progressive-type light-emitting intensity $I(\theta)$ emitted from the optoelectronic component 91 of the light-emitting module can sequentially pass through the first layer 93 and the second layer 92 to generate a second light (not shown) with the same light-emitting intensity I after wavelength conversion of the first light.

Similarly, when the light-emitting angle $\theta$ of the optoelectronic component 91 relative to the vertical center line L is 0 degree, the progressive-type light-emitting intensity $I(\theta=0°)$ generated by the optoelectronic component 91 as shown by $I(0°)=I_0 \cos 0°=I_0$ can correspond to the progressive-type particle radius $R(\theta=0°)$ of the phosphor powder in the second layer 92 as shown by $R(0°)$. When the light-emitting angle $\theta$ of the optoelectronic component 91 relative to the vertical center line L is $\theta_1$, the progressive-type light-emitting intensity $I(\theta=\theta_1)$ generated by the optoelectronic component 91 as shown by $I(\theta_1)=I_0 \cos \theta_1$ can correspond to the progressive-type particle radius $R(\theta=\theta_1)$ as shown by $R(\theta_1)$. When the light-emitting angle $\theta$ of the optoelectronic component 91 relative to the vertical center line L is $\theta_2$, the progressive-type light-emitting intensity $I(\theta=\theta_2)$ generated by the optoelectronic component 91 as shown by $I(\theta_2)=I_0 \cos \theta_2$ can correspond to the progressive-type particle radius $R(\theta=\theta_2)$ as shown by $R(\theta_2)$.

Therefore, when the light-emitting angle $\theta$ is increased gradually such as $0°<\theta_1<\theta_2$, the progressive-type light-emitting intensity $I(\theta)$ is decreased gradually such as $I_0>I_0 \cos \theta_1>I_0 \cos \theta_2$, thus the optoelectronic component 91 cannot provide a uniform light-emitting source due to different light-emitting angles $\theta$ of the optoelectronic component 91. However, when the first layer 93 is covered with the second layer 92, the progressive-type particle radius $R(\theta)$ increased gradually such as $R(0°)<R(\theta_1)<R(\theta_2)$ can correspond to the progressive-type light-emitting intensity $I(\theta)$ decreased gradually such as $I_0>I_0 \cos \theta_1>I_0 \cos \theta_2$, thus the progressive-type light-emitting intensity $I(\theta)$ can be transformed into the same light-emitting intensity I through the progressive-type particle radius $R(\theta)$. In other words, when the progressive-type light-emitting intensity $I(\theta)$ and the progressive-type particle radius $R(\theta)$ are respectively decreased and increased gradually according to the increasing light-emitting angle $\theta$ of the optoelectronic component 91, the progressive-type particle radius $R(\theta)$ multiplied by the progressive-type light-emitting intensity I(θ) can equal to a constant number c as shown by R(θ)*I(θ)=c, thus the progressive-type light-emitting intensity I(θ) generated by the optoelectronic component 91 can be transformed into the same light-emitting intensity I through the progressive-type particle radius R(θ) of the phosphor powder in the second layer 92. Hence, the illumination device 90 can provide a uniform light-emitting source by using the progressive-type particle radius R(θ) of the phosphor powder in the second layer 92.

Figure 3B:
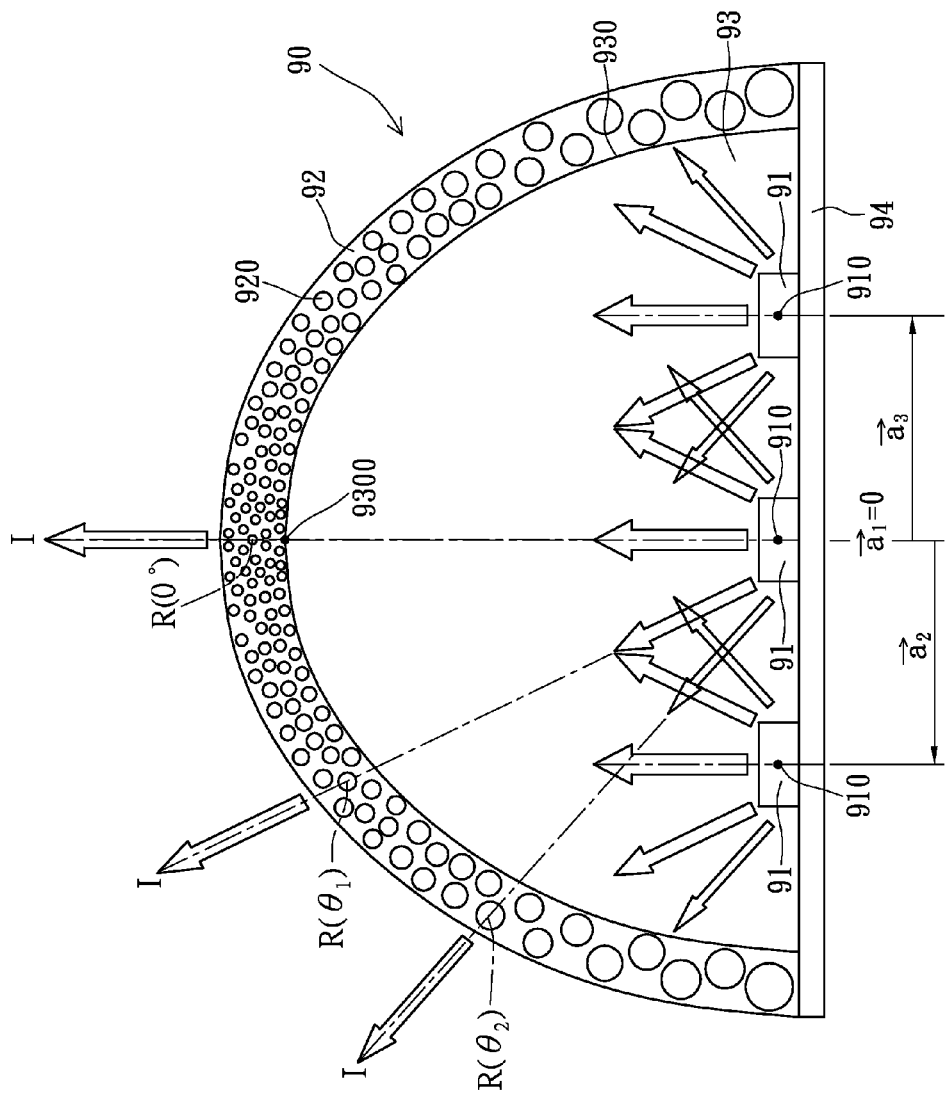
FIG. 3B is an illustration of the illumination device using three optoelectronic components according to the third exemplary embodiment of the instant disclosure.

Referring to FIG. 3B, it shows an illumination device 90 using a plurality of optoelectronic components according to the instant disclosure. The illumination device 90 in FIG. 3B is similar to the illumination device 70 in FIG. 1A or the illumination device 80 in FIG. 2A and includes a base 94, three optoelectronic components 91, a first layer 93, and a second layer 92. Similar to the above description, the three optoelectronic components 91 are served as the light-emitting module for emitting light and can be covered with the first layer 93, and the first layer 93 can be covered with the second layer 92.

Referring to FIGS. 3B and 1C, because the progressive-type light-emitting intensity I(θ) generated by any one of the three optoelectronic components 91 can be a function of θ defined by $$I(\theta) = \frac{I_0 r}{r'^2}\cos\theta = \frac{I_0}{r}\cos\theta\left(1 + \frac{\vec{a}^2}{r^2} - 2\frac{\vec{a}}{r}\sin\theta\right)^{-1}$$

the same as the first embodiment, thus the progressive-type light-emitting intensity I(θ) generated by the light-emitting module including the three optoelectronic components 91 can be a function of θ defined by $$I(\theta) = \sum_i I_i(\theta) = \frac{I_0}{r}\cos\theta\sum_i\left(1 + \frac{\vec{a}_i^2}{r^2} - 2\frac{\vec{a}_i}{r}\sin\theta\right)^{-1},$$

wherein i is the amount of the optoelectronic components 91, $\vec{a}_i$ is a horizontal offset distance between the center point 910 of each corresponding optoelectronic component 91 and the center point 910' of the imaginary optoelectronic component 91' that is imaginatively disposed on a centric position 940 of the base 94, θ is a light-emitting angle of the imaginary optoelectronic component 91' relative to a vertical center line L of the imaginary optoelectronic component 91', $I_0$ is a maximum light-emitting intensity generated by the imaginary optoelectronic component 91', and r is a radius of the first layer 93. Similar to the first embodiment, three optoelectronic components 91 have respective horizontal offset distances $\vec{a}_1$, $\vec{a}_2$, and $\vec{a}_3$ as shown in FIG. 3B. Because of the definition of R(θ)*I(θ)=c, the progressive-type particle radius R(θ) of the phosphor powder in the second layer 92 can be a function of θ defined by $$R(\theta) = c\left[\frac{I_0}{r}\cos\theta\sum_i\left(1 + \frac{\vec{a}_i^2}{r^2} - 2\frac{\vec{a}_i}{r}\sin\theta\right)^{-1}\right]^{-1},$$

thus the progressive-type light-emitting intensity I(θ) generated by the light-emitting module can be transformed into the same light-emitting intensity I through the progressive-type particle radius R(θ) of the phosphor powder in the second layer 92.

Figure 3C:
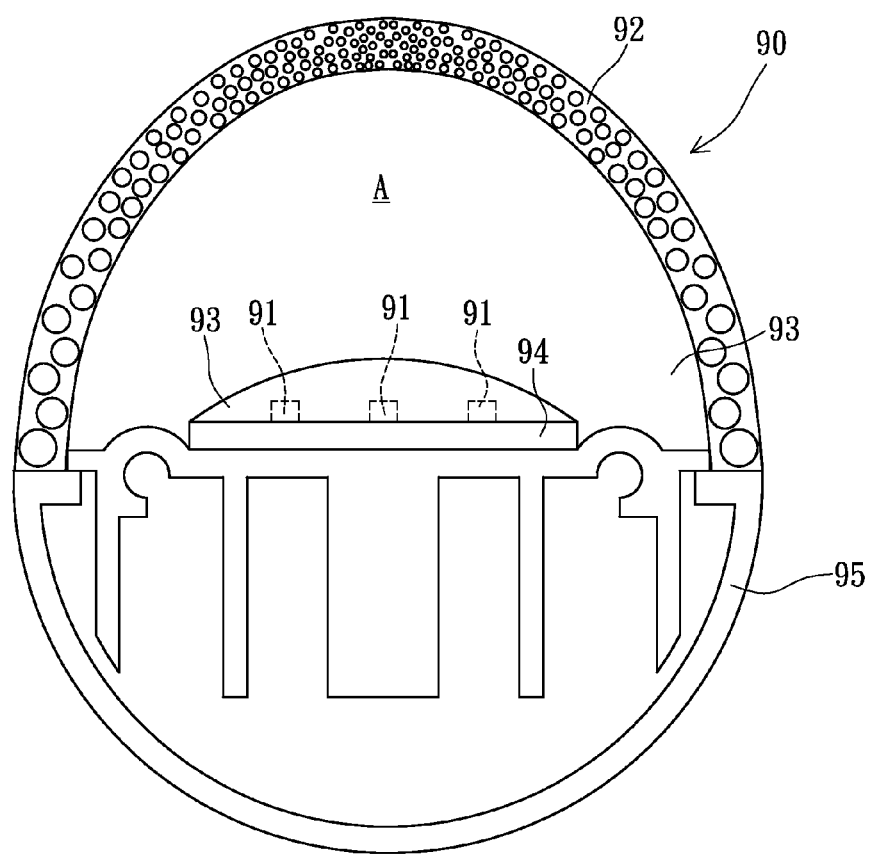
FIG. 3C is an illustration of the illumination device applied as a lamp tube according to the third exemplary embodiment of the instant disclosure.
Figure 3D:
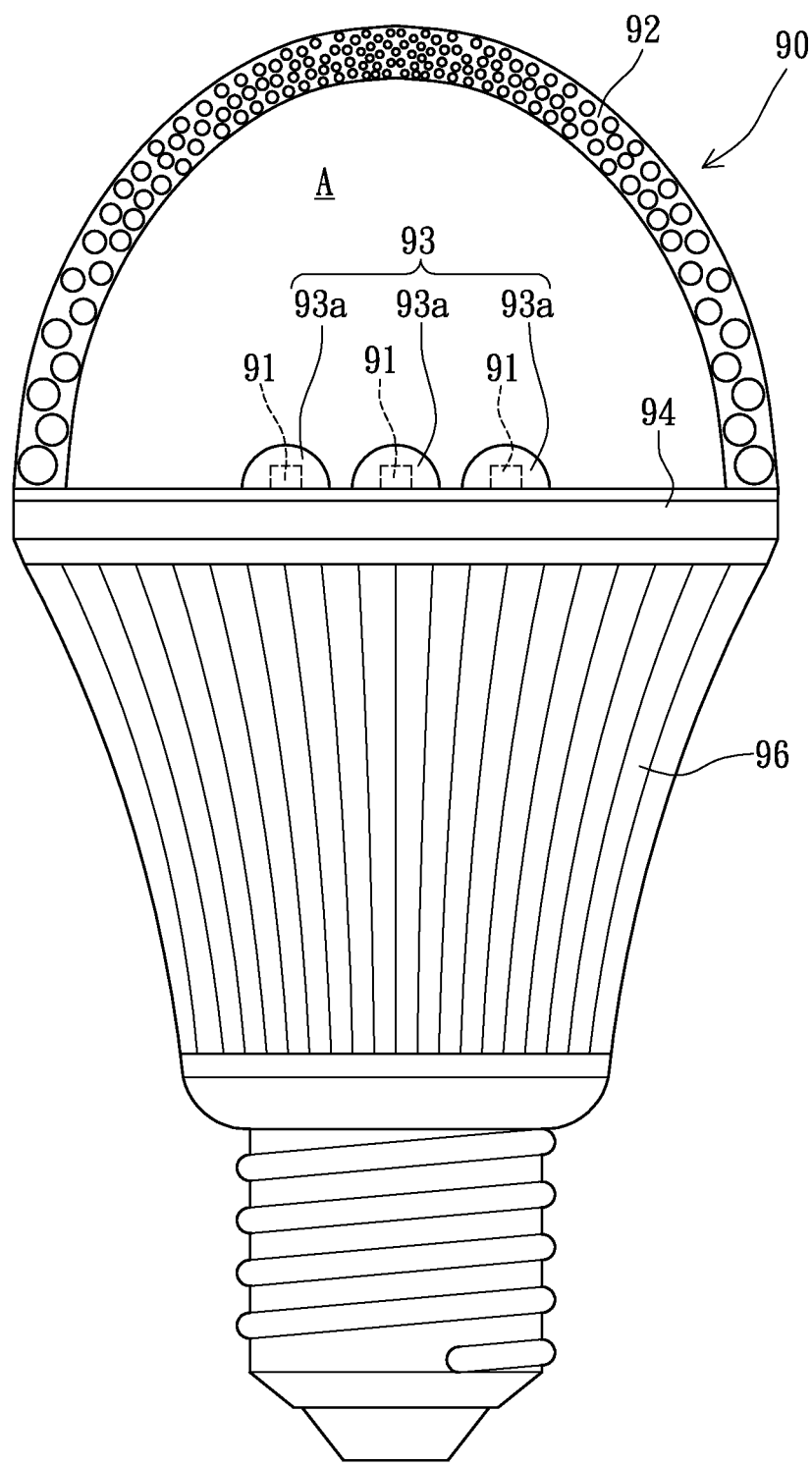
FIG. 3D is an illustration of the illumination device applied as a lamp bulb according to the third exemplary embodiment of the instant disclosure.

Furthermore, the illumination device 90 can further include a holder module that may be a tube holder 95 (as shown in FIG. 3C) or a bulb holder 96 (as shown in FIG. 3D) as a support structure for supporting the base 94. Referring to FIGS. 3C and 3D, the second layer 92 can be separated from the first layer 93 to form an air layer A between the first layer 93 and the second layer 92. In FIG. 3C, the first layer 93 can be a single encapsulation layer to encapsulate three optoelectronic components 91. In FIG. 3D, the first layer 93 having a plurality of encapsulating units 93a used to respectively encapsulate respective optoelectronic components 91. The particle radius of the second layer 92 of the illumination device 90 still has the same relationship as described above. Of course, the type of holder module in FIG. 3C or FIG. 3D can be changed into another type. In alternative embodiment, the structure of encapsulating the optoelectronic components 91 with the first layer 93 in FIG. 3C can be replaced by another structure of respectively encapsulating the optoelectronic components 91 with respective encapsulating units 93a in FIG. 3D, or the structure of respectively encapsulating the optoelectronic components 91 with respective encapsulating units 93a in FIG. 3D can be replaced by another structure of encapsulating the optoelectronic components 91 with the first layer 93 in FIG. 3C. In other words, the illumination device 90 can be used as a lamp tube or a lamp bulb for providing a uniform light-emitting source having the same light-emitting intensity.

In conclusion, when the light-emitting module including at least one or more than two optoelectronic components (71, 81, or 91) disposed on the base (74, 84, or 94) for generating a first light having a progressive-type light-emitting intensity I(θ), the second layer (72, 82, or 92) such as a phosphor layer has a progressive-type structure in correlation with the progressive-type light-emitting intensity I(θ), thus the first light emitted from the light-emitting module can pass through the second layer (72, 82, or 92) to generate a second light having the same light-emitting intensity I. For example, the progressive-type structure may be one of a progressive-type thickness d(θ), a progressive-type concentration D(θ) of the phosphor powder, and a progressive-type particle radius R(θ) of the phosphor powder.

Those skilled in the art will readily observe that numerous modifications and alterations of the device and method may be made while retaining the teachings of the invention.

What is claimed is:

1. An illumination device, comprising:
   a base;
   a light-emitting module disposed on the base for generating a progressive-type light-emitting intensity;
   a first layer encapsulating the light-emitting module; and
   a second layer enclosing the first layer and having a phosphor powder, wherein the second layer has a progressive-type concentration of the phosphor powder corresponding to the progressive-type light-emitting intensity, both the progressive-type light-emitting intensity and the progressive-type concentration of the phosphor powder are decreased or increased gradually, and the progressive-type light-emitting intensity is transformed into the same light-emitting intensity through the progressive-type concentration of the phosphor powder in the second layer;
   wherein the light-emitting module includes at least one optoelectronic component disposed on the base and directly under a topmost point of the first layer, the progressive-type light-emitting intensity generated by the at least one optoelectronic component is a function of θ defined by $I(\theta)=I_0 \cos\theta$, and the progressive-type concentration of the phosphor powder is a function of θ defined by $D(\theta)=cI_0 \cos\theta$, wherein θ is a light-emitting angle of the at least one optoelectronic component relative to a vertical center line vertically passing through a center point of the at least one optoelectronic component, $I_0$ is a maximum light-emitting intensity generated by the at least one optoelectronic component, and c is a constant number.

2. The illumination device of claim 1, wherein the at least one optoelectronic component is covered with the first layer, and the first layer is covered with the second layer, wherein the first layer is one of a transparent layer, a translucent layer, and an air layer.

3. The illumination device of claim 1, further comprising: a holder module being one of a tube holder and a bulb holder for supporting the base, wherein the at least one optoelectronic component is covered with the first layer, and the second layer is separated from the first layer to form an air layer between the first layer and the second layer.

4. An illumination device, comprising:
a base;
a light-emitting module disposed on the base for generating a progressive-type light-emitting intensity;
a first layer encapsulating the light-emitting module; and
a second layer enclosing the first layer and having a phosphor powder, wherein the second layer has a progressive-type concentration of the phosphor powder corresponding to the progressive-type light-emitting intensity, both the progressive-type light-emitting intensity and the progressive-type concentration of the phosphor powder are decreased or increased gradually, and the progressive-type light-emitting intensity is transformed into the same light-emitting intensity through the progressive-type concentration of the phosphor powder in the second layer;
wherein the light-emitting module includes a plurality of optoelectronic components disposed on the base, the progressive-type light-emitting intensity generated by the light-emitting module is a function of θ defined by $$I(\theta) = \sum_i I_i(\theta) = \frac{I_0}{r}\cos\theta \sum_i \left(1 + \frac{\vec{a}_i^2}{r^2} - 2\frac{\vec{a}_i}{r}\sin\theta\right)^{-1},$$

and the progressive-type concentration of the phosphor powder in the second layer is a function of θ defined by $$D(\theta) = c\frac{I_0}{r}\cos\theta \sum_i \left(1 + \frac{\vec{a}_i^2}{r^2} - 2\frac{\vec{a}_i}{r}\sin\theta\right)^{-1},$$

wherein i is the amount of the optoelectronic components, $\vec{a}_i$, is a horizontal offset distance between a center point of each corresponding optoelectronic component and a center point of an imaginary optoelectronic component that is imaginatively disposed on a centric position of the base, θ is a light-emitting angle of the imaginary optoelectronic component relative to a vertical center line vertically passing through a center point of the imaginary optoelectronic component, $I_0$ is a maximum light-emitting intensity generated by the imaginary optoelectronic component, r is a radius of the first layer, and c is a constant number.

5. The illumination device of claim 4, further comprising: a holder module being one of a tube holder and a bulb holder for supporting the base, wherein the optoelectronic components are covered with the first layer or respectively covered with a plurality of encapsulating units of the first layer, and the second layer is separated from the first layer to form an air layer between the first layer and the second layer, wherein the first layer is one of a transparent layer, a translucent layer, and an air layer.

\* \* \* \* \*